United States Patent
Im et al.

(10) Patent No.: US 11,646,604 B2
(45) Date of Patent: May 9, 2023

(54) WIRELESS DEVICE INCLUDING THERMOELECTRIC AND PHOTOELECTRIC ENERGY HARVESTING ELEMENTS AND OPERATING METHOD THEREOF

(71) Applicant: ELECTRONICS AND TELECOMMUNICATIONS RESEARCH INSTITUTE, Daejeon (KR)

(72) Inventors: Jong Pil Im, Daejeon (KR); Jeong Hun Kim, Daejeon (KR); Seungeon Moon, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 17/396,271

(22) Filed: Aug. 6, 2021

(65) Prior Publication Data

US 2022/0140649 A1    May 5, 2022

(30) Foreign Application Priority Data

Nov. 2, 2020    (KR) .................. 10-2020-0144532
May 27, 2021    (KR) .................. 10-2021-0068465

(51) Int. Cl.
     *H02J 50/00*      (2016.01)
     *H02S 10/30*      (2014.01)
     (Continued)

(52) U.S. Cl.
     CPC .......... *H02J 50/001* (2020.01); *H01L 31/042* (2013.01); *H02J 1/109* (2020.01); *H02J 7/345* (2013.01);
     (Continued)

(58) Field of Classification Search
CPC .. H02J 50/001; H02J 7/34–35; H01J 1/10–12; H02S 10/10; H02S 10/30
See application file for complete search history.

(56) References Cited

U.S. PATENT DOCUMENTS

2006/0281435 A1* 12/2006 Shearer ................. H02J 50/001
     455/343.1
2009/0209303 A1* 8/2009 Kroll ...................... H02J 50/20
     455/575.2

(Continued)

FOREIGN PATENT DOCUMENTS

| KR | 300867542 S | 8/2016 |
|---|---|---|
| KR | 101673996 B1 | 11/2016 |
| KR | 101835097 B1 | 3/2018 |

OTHER PUBLICATIONS

Abu Raihan Mohammad Siddique, Shohei Mahmud, Bill Van Heyst, "A review of the state of the science on wearable thermoelectric power generators (TEGs) and their existing challenges", Feb. 4, 2017, Renewable and Sustainable Energy Reviews, vol. 73, 2017, p. 730-744. (Year: 2017).*

(Continued)

*Primary Examiner* — Rexford N Barnie
*Assistant Examiner* — David A Shiao
(74) *Attorney, Agent, or Firm* — Rabin & Berdo, P.C.

(57) ABSTRACT

Disclosed are a wireless device capable of being self-powered and an operating method thereof. The wireless device includes an energy harvesting module that generates electrical energy based on energy supplied from an outside, a power management module that generates a voltage based on the electrical energy provided from the energy harvesting module, a user input interface that includes at least one input device sensing an input of a user, and a communication module that transfers a command corresponding to the at least one input device to the outside based on the voltage (Continued)

provided from the power management module, in response to that the at least one input device is accessed by the user.

16 Claims, 6 Drawing Sheets

(51) Int. Cl.
  H01L 31/042 (2014.01)
  H02J 1/10 (2006.01)
  H02J 7/35 (2006.01)
  H02J 7/34 (2006.01)
(52) U.S. Cl.
  CPC .............. H02J 7/35 (2013.01); H02S 10/30 (2014.12); H10N 10/13 (2023.02); H10N 10/17 (2023.02)

(56) References Cited

U.S. PATENT DOCUMENTS

| | | | |
|---|---|---|---|
| 2011/0150018 A1 | 6/2011 | Park et al. | |
| 2012/0091968 A1* | 4/2012 | Heo | H02J 7/35 320/138 |
| 2013/0043858 A1* | 2/2013 | Ramadass | H02M 3/155 323/311 |
| 2014/0246908 A1* | 9/2014 | Chew | H04Q 9/00 307/31 |
| 2014/0333136 A1* | 11/2014 | Olah | H02J 7/35 307/46 |
| 2015/0311707 A1* | 10/2015 | Ikenaga | H02J 50/001 307/71 |
| 2016/0211742 A1* | 7/2016 | Mohammad | H02J 50/00 |
| 2017/0012193 A1* | 1/2017 | Jogia | H02J 50/00 |
| 2017/0279276 A1* | 9/2017 | Amin | H02J 3/38 |
| 2018/0351366 A1* | 12/2018 | Handelsman | H02J 1/102 |
| 2020/0220451 A1* | 7/2020 | De Vos | H02M 3/156 |
| 2020/0303890 A1 | 9/2020 | Kim | |

OTHER PUBLICATIONS

"Solar cell", Nov. 1, 2020, Wikipedia, retrieved via Wayback machine at <https://web.archive.org/web/20201101213158/https://en.wikipedia.org/wiki/Solar_cell> (Year: 2020).*

* cited by examiner

WIRELESS DEVICE INCLUDING THERMOELECTRIC AND PHOTOELECTRIC ENERGY HARVESTING ELEMENTS AND OPERATING METHOD THEREOF

CROSS-REFERENCE TO RELATED APPLICATIONS

This application claims priority under 35 U.S.C. § 119 to Korean Patent Application Nos. 10-2020-0144532 filed on Nov. 2, 2020 and 10-2021-0068465 filed on May 27, 2021, in the Korean Intellectual Property Office, the disclosures of which are incorporated by reference herein in their entireties.

BACKGROUND

Embodiments of the present disclosure described herein relate to a wireless device, and more particularly, relate to a wireless device capable of being self-powered by using an energy harvesting element and an operating method thereof.

In general, a wireless device operates by using a power supplied from the outside or a battery installed therein. A battery that is used in an existing electronic device is implemented with a device that includes one or more cells, which convert and store chemical energy into electricity to power the electronic device and generate a direct current power. The battery used in the existing electronic device requires periodic replacement or periodic charging.

However, some configurations for processing a power supplied from the outside and a battery installed therein cause limitations in reducing the size of the wireless device. Accordingly, there is a need for implementing a wireless device capable of minimizing power consumption while achieving the miniaturization of the wireless device.

SUMMARY

Embodiments of the present disclosure provide a wireless device capable of being self-powered by using an energy harvesting element and an operating method thereof.

According to an embodiment, a wireless device capable of being self-powered includes an energy harvesting module that generates electrical energy based on energy supplied from an outside, a power management module that generates a voltage based on the electrical energy provided from the energy harvesting module, a user input interface that includes at least one input device sensing an input of a user, and a communication module that transfers a command corresponding to the at least one input device to the outside based on the voltage provided from the power management module, in response to that the at least one input device is accessed by the user.

In an embodiment, the energy harvesting module includes a thermoelectric element array including a plurality of thermoelectric elements, and a photoelectric element array including a plurality of photoelectric elements.

In an embodiment, each of the plurality of thermoelectric elements includes a heat absorption layer, a heat sink layer, a first doping material, and a second doping material, the heat sink layer is disposed under each of the plurality of thermoelectric elements, the first doping material and the second doping material are disposed on the heat sink layer so as to be spaced from each other, and the first doping material is connected with the heat sink layer by a first electrode. The second doping material is connected with the heat sink layer by a second electrode, a third electrode is disposed on the first doping material, a fourth electrode is disposed on the second doping material, and the heat absorption layer is disposed on the third electrode and the fourth electrode.

In an embodiment, the heat absorption layer and the heat sink layer are formed of a metal substrate including aluminum (Al), aluminum (Al) alloy, copper (Cu), copper (Cu) alloy, or copper-aluminum (Cu—Al) alloy.

In an embodiment, the heat absorption layer and the heat sink layer are formed of an alumina substrate or a polymer resin substrate.

In an embodiment, the first electrode, the second electrode, the third electrode, and the fourth electrode are formed of a metal material including copper (Cu), silver (Ag), or nickel (Ni).

In an embodiment, each of the plurality of photoelectric elements includes a first electrode, a second electrode, a first doping material, and a second doping material, the first electrode is disposed under each of the plurality of photoelectric elements, the first doping material is disposed on the first electrode, the second doping material is disposed on the first doping material, and the second electrode is disposed on the second doping material.

In an embodiment, the power management module includes at least one maximum power point tracking (MPPT) circuit that extracts maximum energy of the electrical energy provided from the energy harvesting module, a continuous power transfer (CPT) circuit that continuously supplies electrical energy extracted from the at least one MPPT circuit, and a main control circuit that controls the extracted electrical energy supplied from the CPT circuit.

In an embodiment, the power management module generates a voltage based on a time-division multiple power transfer manner.

In an embodiment, the wireless device further includes a light source configured to emit a laser beam to the outside in response to that the at least one input device is accessed by the user.

In an embodiment, in response to that the at least one input device is accessed by the user, the communication module generates a control signal for controlling an external display device and sends the control signal to the external display device.

According to an embodiment of the present disclosure, an operating method of a wireless device capable of being self-powered includes obtaining first electrical energy from thermal energy transferred from an outside, generating a first voltage for driving the wireless device based on the obtained first electrical energy, supplying the first voltage to a communication module, and driving the wireless device based on the first voltage.

In an embodiment, the method further includes obtaining second electrical energy from light energy transferred from the outside, and generating a second voltage for driving the wireless device based on the obtained second electrical energy.

In an embodiment, the method further includes supplying a continuous output by using the first electrical energy and the second electrical energy in a time-division multiple power transfer manner.

In an embodiment, the method further includes extracting first maximum energy of the first electrical energy, and extracting second maximum energy of the second electrical energy.

In an embodiment, the method further includes controlling whether to output the first maximum energy extracted from the first electrical energy and the second maximum energy extracted from the second electrical energy.

BRIEF DESCRIPTION OF THE FIGURES

The above and other objects and features of the present disclosure will become apparent by describing in detail embodiments thereof with reference to the accompanying drawings.

DETAILED DESCRIPTION

Figure 1:
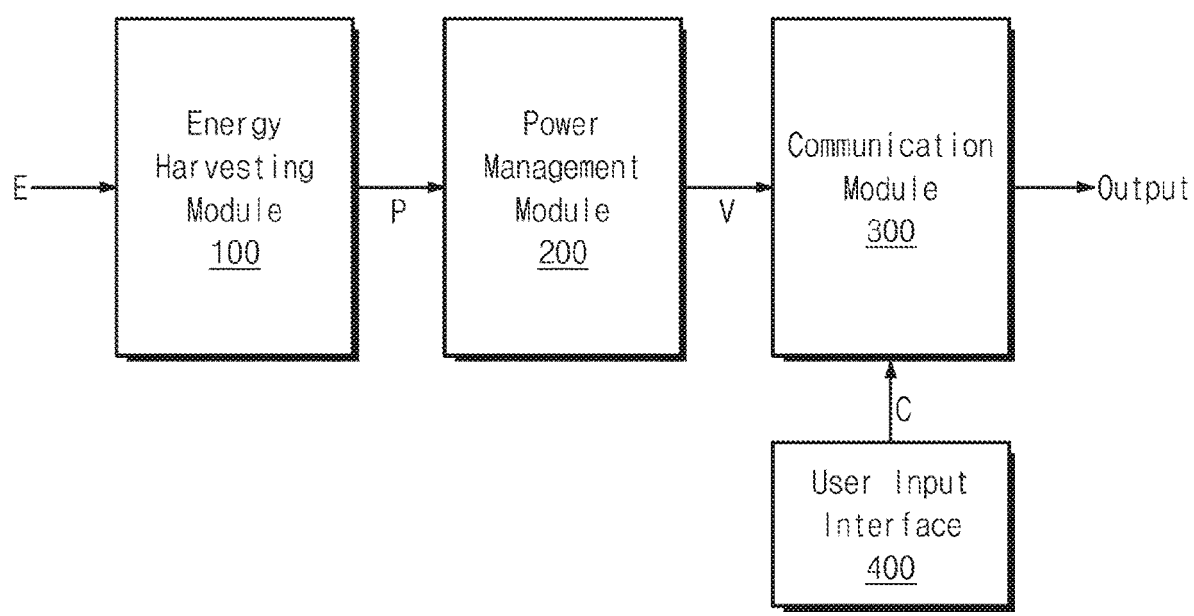
FIG. 1 is a diagram illustrating a wireless device according to an embodiment of the present disclosure.

Below, embodiments of the present disclosure may be described in detail and clearly to such an extent that an ordinary one in the art easily implements the invention.

The terms used in the specification are provided to describe the embodiments, not to limit the present disclosure. As used in the specification, the singular terms "a," "an" and "the" are intended to include the plural forms as well, unless the context clearly indicates otherwise. The terms "comprises" and/or "comprising," when used in the specification, specify the presence of steps, operations, elements, and/or components, but do not preclude the presence or addition of one or more other steps, operations, elements, components, and/or groups thereof.

In the specification, the term "first and/or second" will be used to describe various elements but will be described only for the purpose of distinguishing one element from another element, not limiting an element of the corresponding term. For example, without departing the scope of the present disclosure, a first element may be referred to as a second element, and similarly, a second element may be referred to as a first element.

Unless otherwise defined, all terms (including technical and scientific terms) used in the specification should have the same meaning as commonly understood by those skilled in the art to which the present disclosure pertains. The terms, such as those defined in commonly used dictionaries, should not be interpreted in an idealized or overly formal sense unless expressly so defined herein. The same reference numerals represent the same elements throughout the specification.

FIG. 1 is a diagram illustrating a wireless device 10 according to an embodiment of the present disclosure. For example, the wireless device 10 according to an embodiment of the present disclosure may be a wireless laser pointer or a wireless laser controller. Referring to FIG. 1, the wireless device 10 according to an embodiment of the present disclosure may include an energy harvesting module 100, a power management module 200, a communication module 300, and a user input interface 400.

The energy harvesting module 100 may be supplied with energy "E" from the outside. For example, the energy "E" supplied from the outside may include thermal energy or light energy. The energy harvesting module 100 may convert the energy "E" supplied from the outside into electrical energy "P". The energy harvesting module 100 according to an embodiment of the present disclosure may include an energy harvesting element. For example, the energy harvesting element may be a thermoelectric element or a photoelectric element. A configuration and an operation principle of the energy harvesting module 100 will be described in detail with reference to FIG. 2.

The power management module 200 may be supplied with the electrical energy "P" from the energy harvesting module 100. The power management module 200 may generate a stable voltage "V" for driving the wireless device 10 by using the electrical energy "P" supplied from the energy harvesting module 100. To drive the wireless device 10, the power management module 200 may supply the stable voltage "V" to the communication module 300. To continuously supply the stable voltage "V" to the communication module 300, the power management module 200 may generate the stable voltage "V" based on a time-division multiple power transfer manner. A configuration and an operation principle of the power management module 200 will be described in detail with reference to FIGS. 3 to 5.

The communication module 300 may perform a communication operation with any other component(s) included in the wireless device 10 according to the present disclosure or may perform a communication operation between the wireless device 10 and an external device. For example, the communication module 300 may include a micro controller unit (MCU). The communication module 300 may drive the wireless device 10 based on the stable voltage "V" supplied from the power management module 200. For example, in the case where the wireless device 10 is a wireless laser pointer, the communication module 300 may transfer, to a light source (not illustrated), a command (or instruction) for emitting a laser beam from the light source to the outside. Alternatively, in the case where the wireless device 10 is a wireless laser controller, the communication module 300 may generate a control signal for controlling an external display device compatible with the wireless device 10 and may transfer the control signal to the external display device.

The user input interface 400 may sense an input of the user. The user input interface 400 may include at least one input device. The user input interface 400 may allow at least one input device to transfer a command signal "C" corresponding to an access of the user to the communication module 300. The communication module 300 may perform the above-described communication operation based on the command signal "C".

The wireless device 10 according to an embodiment of the present disclosure may generate the electrical energy "P" by itself based on the energy harvesting module 100. Also, the wireless device 10 may drive the wireless device 10 by supplying the continuous, stable voltage "V" to the communication module 300 by using the electrical energy "P" generated from the energy harvesting module 100. Accordingly, the wireless device 10 may be stably driven without a separate external power.

Figure 2:
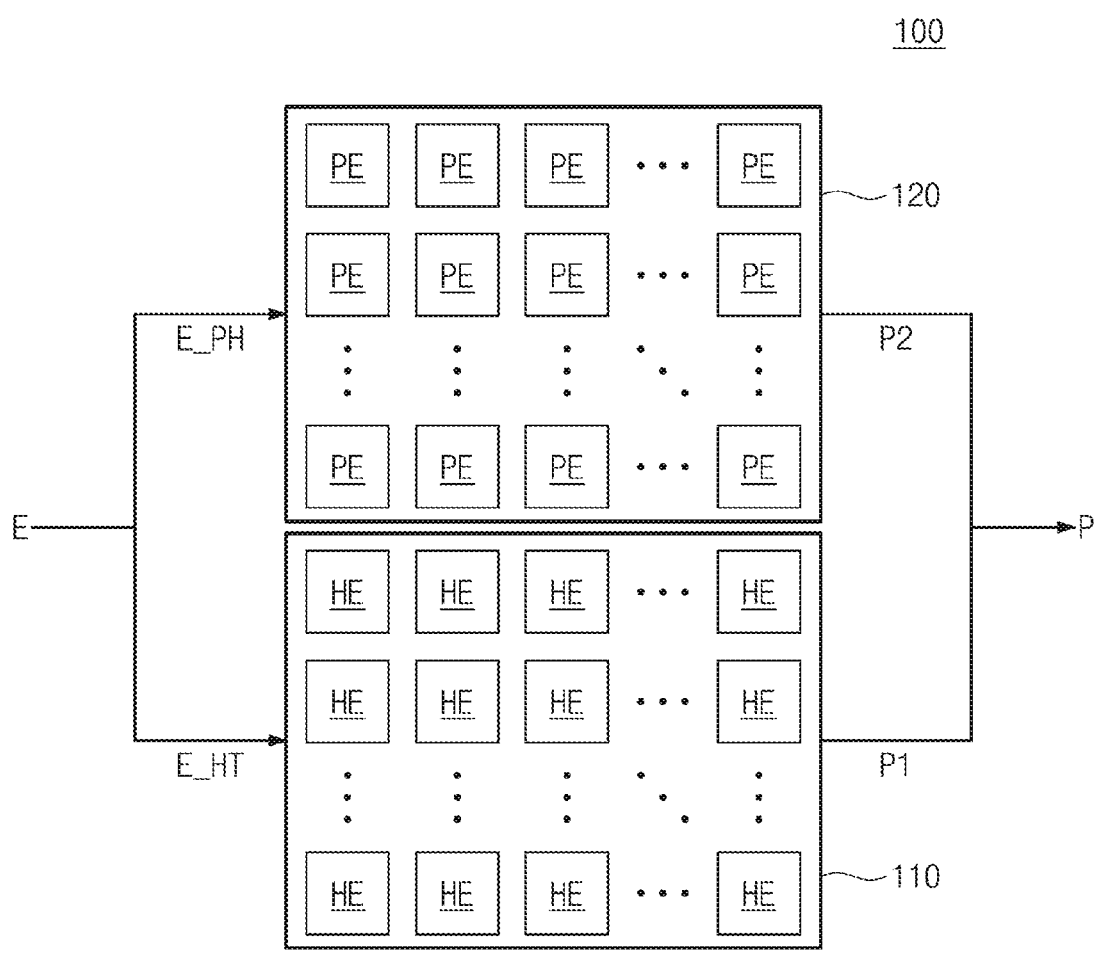
FIG. 2 is a diagram illustrating an energy harvesting module according to an embodiment of the present disclosure.

FIG. 2 is a diagram illustrating the energy harvesting module 100 according to an embodiment of the present disclosure. Referring to FIG. 2, the energy harvesting module 100 may include a thermoelectric element array 110 and a photoelectric element array 120.

The thermoelectric element array 110 may include a plurality of thermoelectric elements HE arranged in rows and columns. Although not illustrated in FIG. 2, each of the plurality of thermoelectric elements HE may include a heat absorption layer, a heat sink layer, a first doping material, and a second doping material. The heat sink layer may be formed at lower portion of the thermoelectric element HE. The first doping material and the second doping material may be disposed on the heat sink layer so as to be spaced from each other. The first doping material and the second doping material may be connected with the heat sink layer through electrodes. The electrodes may be disposed on the first doping material and the second doping material. The heat absorption layer may be disposed on the electrodes that are disposed on the first doping material and the second doping material.

The heat absorption layer and the heat sink layer may be formed of a metal substrate or an insulating substrate. For example, in the case where the heat absorption layer and the heat sink layer are formed of a metal substrate, the heat absorption layer and the heat sink layer may include Al, Al alloy, Cu, Cu alloy, or Cu—Al alloy. For example, in the case where the heat absorption layer and the heat sink layer are formed of an insulating substrate, the heat absorption layer and the heat sink layer may be an alumina substrate or a polymer resin substrate. The polymer resin substrate may be flexible. For example, the polymer resin substrate may be polyimide (PI), polystyrene (PS), polymethyl methacrylate (PMMA), or polyethylene terephthalate (PET). For example, the first doping material may be an n-type semiconductor, and the second doping material may be a p-type semiconductor. The electrodes being in contact with the first doping material and the second doping material may be formed of a metal material. For example, the electrodes may be copper (Cu), silver (Ag) or nickel (Ni).

When thermal energy is supplied to the thermoelectric element HE by the heat absorption layer, a temperature gradient ΔT may occur between the heat absorption layer and the heat sink layer of the thermoelectric element HE by the supplied thermal energy. The temperature gradient ΔT means a value obtained by dividing a temperature difference between two adjacent points by a distance between the two adjacent points. Due to the temperature gradient ΔT, electrons in the first doping material may move toward the heat absorption layer from the heat sink layer. Due to the temperature gradient ΔT, holes in the second doping material may move toward the heat sink layer from the heat absorption layer. As such, electrical energy may be generated at the thermoelectric element HE by a flow of a current generated at the first doping material and the second doping material.

The photoelectric element array 120 may include a plurality of photoelectric elements PE arranged in rows and columns. Although not illustrated in FIG. 2, each of the plurality of photoelectric elements PE may include a first electrode, a second electrode, a first doping material, and a second doping material. The first electrode may be disposed at lower portion of the photoelectric element PE. The first doping material may be disposed on the first electrode. The second doping material may be disposed on the first doping material. The second electrode may be disposed on the second doping material. For example, the first doping material may be a p-type semiconductor, and the second doping material may be an n-type semiconductor. The first doping material and the second doping material may form a p-n junction. The first and second electrodes being in contact with the first doping material and the second doping material may be formed of a metal material. For example, the electrodes may be copper (Cu), silver (Ag) or nickel (Ni).

When light energy is injected into the photoelectric element PE through the first electrode, electrons and holes may move in the photoelectric element PE due to the photoelectric effect. For example, when light energy is injected into the photoelectric element PE, holes may move from the first doping material to the second doping material, and electrons may move from the second doping material to the first doping material. As such, electrical energy may be generated at the photoelectric element PE by a flow of a current generated at the first doping material and the second doping material.

The energy harvesting module 100 may be supplied with the energy "E" from the outside. For example, the energy "E" supplied from the outside may include thermal energy E_HT or light energy E_PH. The thermal energy E_HT supplied from the outside may be provided to the thermoelectric element array 110, and the light energy E_PH supplied from the outside may be provided to the photoelectric element array 120. Each of the plurality of thermoelectric elements HE included in the thermoelectric element array 110 may generate first electrical energy P1 based on the thermal energy E_HT supplied from the outside. Each of the plurality of photoelectric elements PE included in the photoelectric element array 120 may generate second electrical energy P2 based on the light energy E_PH supplied from the outside. The electrical energy "P" including the first electrical energy P1 generated from the thermoelectric element array 110 and the second electrical energy P2 generated from the photoelectric element array 120 may be provided to the power management module 200 (refer to FIG. 1).

Figure 3:
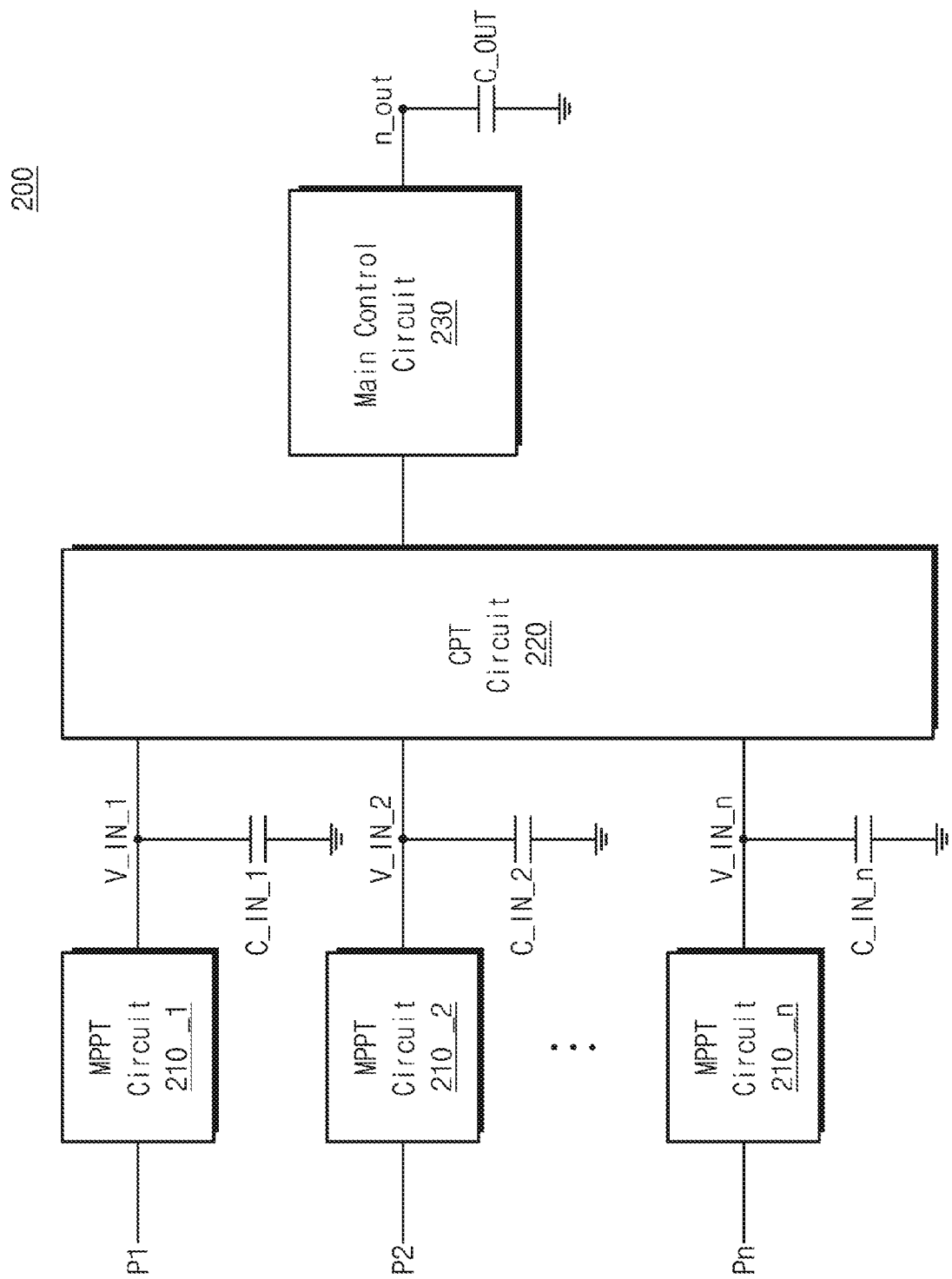
FIG. 3 is a diagram illustrating a power management module according to an embodiment of the present disclosure.

FIG. 3 is a diagram illustrating the power management module 200 according to an embodiment of the present disclosure. Referring to FIG. 3, the power management module 200 may include first to n-th maximum power point tracking (MPPT) circuits 210_1, 210_2 . . . 210_n, first to n-th input capacitors C_IN_1, C_IN_2 . . . C_IN_n, a continuous power transfer (CPT) circuit 220, a main control circuit 230, and an output capacitor C_OUT.

Each of the first to n-th MPPT circuits 210_1, 210_2 . . . 210_n may be electrically connected with the CPT circuit 220. First ends of the first to n-th input capacitors C_IN_1, C_IN_2 . . . C_IN_n may be respectively connected with electrical connections between the first to n-th MPPT circuits 210_1, 210_2 . . . 210_n and the CPT circuit 220. Second ends of the first to n-th input capacitors C_IN_1, C_IN_2 . . . C_IN_n may be grounded. The CPT circuit 220 may be electrically connected with the main control circuit 230, the main control circuit 230 may be electrically connected with a first end of the output capacitor C_OUT, and a second end of the output capacitor C_OUT may be grounded.

The first to n-th MPPT circuits 210_1, 210_2 . . . 210_n may constitute a circuit for maximally extracting a power from the energy harvesting module 100 (refer to FIG. 1). First to n-th energy P1, P2 . . . Pn respectively supplied to the first to n-th MPPT circuits 210_1, 210_2 . . . 210_n may include electrical energy generated from the thermoelectric element array 110 (refer to FIG. 2), electrical energy generated from the photoelectric element array 120 (refer to FIG. 2), electrical energy generated from each of the plurality of thermoelectric elements HE included in the thermoelectric element array 110, electrical energy generated from each of the plurality of photoelectric elements PE included in the photoelectric element array 120. A circuit structure of each of the first to n-th MPPT circuits 210_1, 210_2 . . . 210_n will be described in detail with reference to FIG. 4.

The CPT circuit 220 may sequentially output the energy that is stored in the first to n-th input capacitors C_IN_1, C_IN_2 . . . C_IN_n after extracted from the first to n-th MPPT circuits 210_1, 210_2 . . . 210_n. The CPT circuit 220 may adjust an analog control sequence such that there occurs no case where the input energy is not transferred to an output due to insufficient input energy or the input energy is fully charged at the same time, that is, may control a comparator to continuously output the stored energy. An operation principle of the CPT circuit 220 will be described in detail with reference to FIG. 5.

To output the stable voltage "V", the main control circuit 230 (e.g., a boost converter or a buck converter) may control a frequency and a duty of a boost (or buck) converter that generates an output voltage from a voltage input from the first to n-th input capacitors C_IN_1, C_IN_2 . . . C_IN_n.

Figure 4:
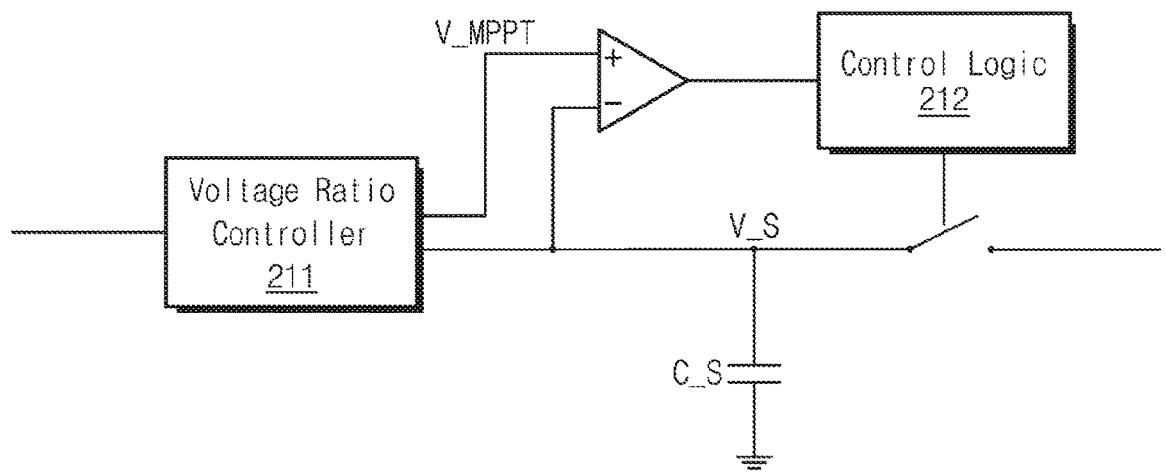
FIG. 4 is a diagram illustrating an MPPT circuit according to an embodiment of the present disclosure.

FIG. 4 is a diagram illustrating an MPPT circuit 210 according to an embodiment of the present disclosure. Referring to FIG. 4, the MPPT circuit 210 may include a voltage ratio controller 211 and control logic 212. The MPPT circuit 210 may be supplied with the electrical energy "P" generated from the energy harvesting module 100 (refer to FIG. 1). The voltage ratio controller 211 of the MPPT circuit 210 may control an MPPT voltage V_MPPT to maximally extract energy from the supplied electrical energy "P".

The control logic 212 may control an on/off of a switch such that electrical energy is output from the MPPT circuit 210 while maintaining the MPPT voltage V_MPPT. The electrical energy respectively output from the first to n-th MPPT circuits 210_1, 210_2 . . . 210_n may be charged in the first to n-th input capacitors C_IN_1, C_IN_2 . . . C_IN_n disposed between the first to n-th MPPT circuits 210_1, 210_2 . . . 210_n and the CPT circuit 220.

Figure 5:
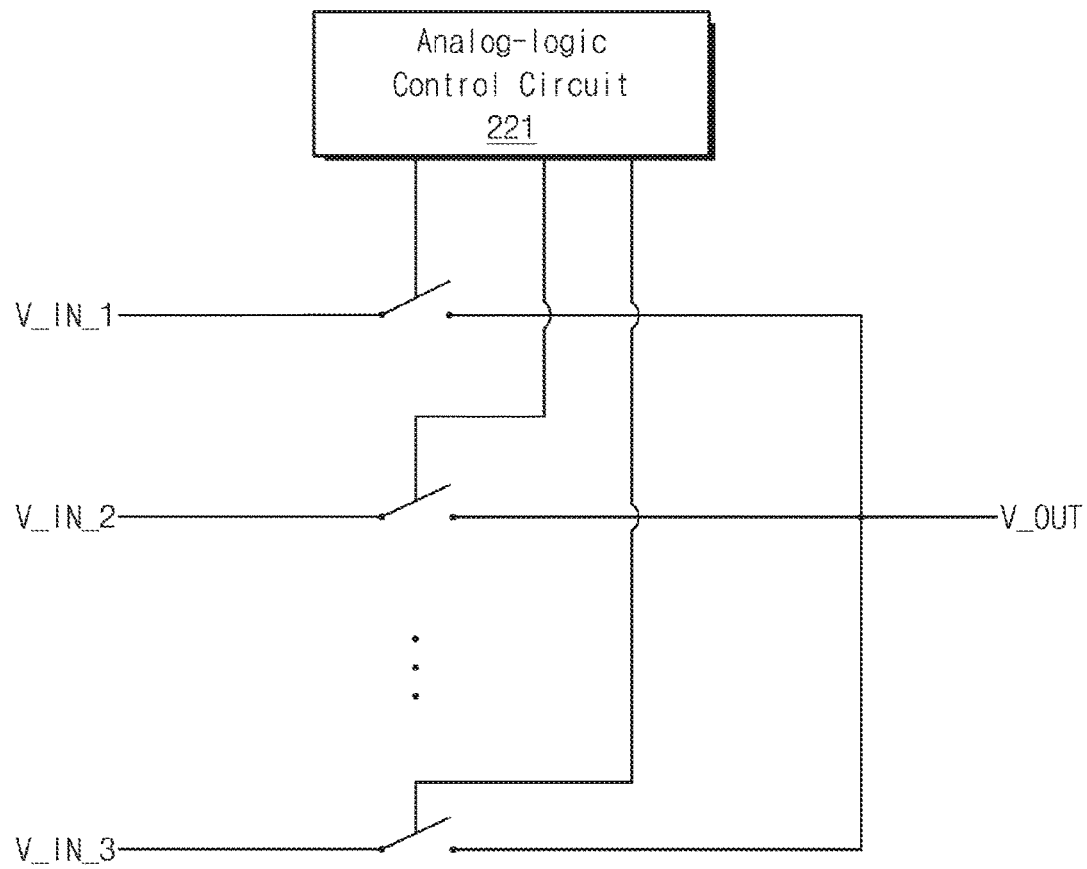
FIG. 5 is a diagram illustrating a CPT circuit according to an embodiment of the present disclosure.

FIG. 5 is a diagram illustrating the CPT circuit 220 according to an embodiment of the present disclosure. The CPT circuit 220 may include an analog-logic control circuit 221 and a plurality of switches. The CPT circuit 220 may receive first to n-th input voltages V_IN_1, V_IN_2 . . . V_IN_n charged in the first to n-th input capacitors C_IN_1, C_IN_2 . . . C_IN_n disposed between the first to n-th MPPT circuits 210_1, 210_2 . . . 210_n and the CPT circuit 220. Whether to output the first to n-th input voltages V_IN_1, V_IN_2 . . . V_IN_n in turn or at the same time may be determined based on a logic sequence implemented by the analog-logic control circuit 221.

The CPT circuit 220 may sequentially and continuously supply the first to n-th input voltages V_IN_1, V_IN_2 . . . V_IN_n from the MPPT circuit 210 (refer to FIG. 4) to the main control circuit 230. For example, the CPT circuit 220 may transfer energy charged in an input capacitor C_IN to an output in an order in which an input voltage V_IN arrives at an MPPT voltage V_MPPT_1 in the MPPT circuit 210.

Figure 6:
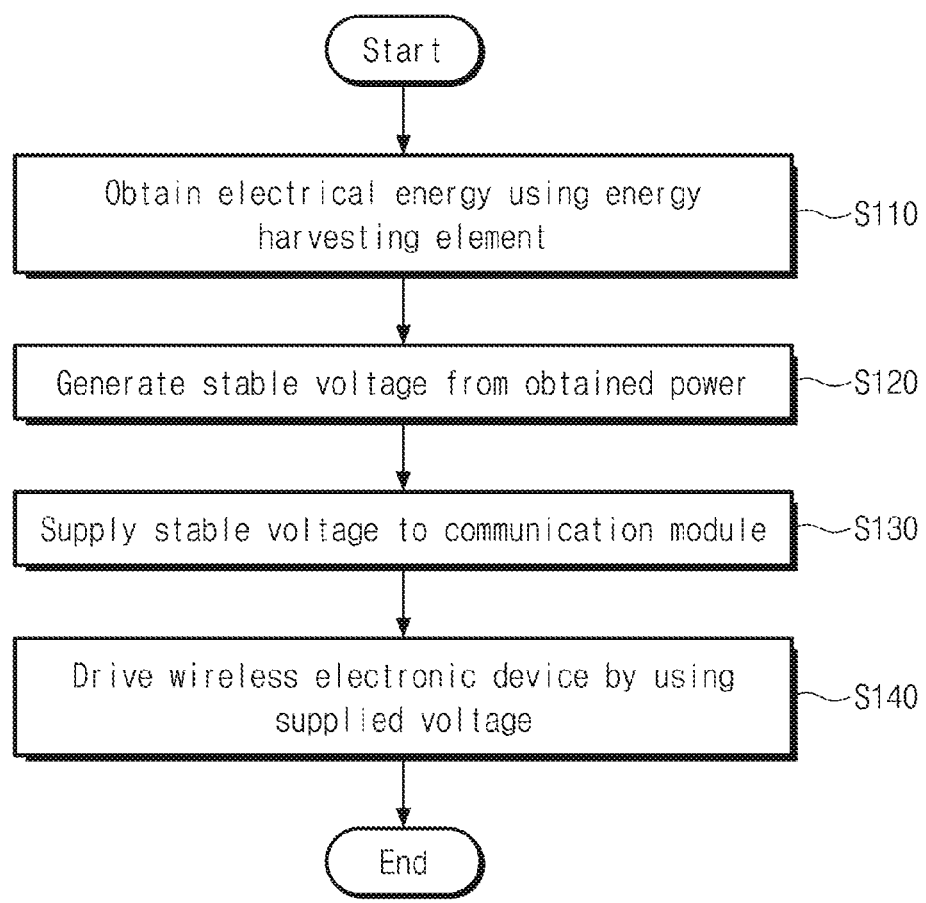
FIG. 6 is a flowchart illustrating an operating method of a wireless device according to an embodiment of the present disclosure.

FIG. 6 is a flowchart illustrating an operating method of the wireless device 10 (refer to FIG. 1) according to an embodiment of the present disclosure.

In operation S110, the wireless device 10 may obtain the electrical energy "P" (refer to FIG. 1) based on the energy "E" (refer to FIG. 1) transferred from the outside through the energy harvesting module 100 (refer to FIG. 1). In an embodiment of the present disclosure, in the energy harvesting module 100, the thermoelectric element array 110 (refer to FIG. 2) including the plurality of thermoelectric elements HE (refer to FIG. 2) may obtain the electrical energy P1 (refer to FIG. 2) by using the thermal energy E_HT of the energy "E" transferred from the outside, and the photoelectric element array 120 (refer to FIG. 2) including the plurality of photoelectric elements PE (refer to FIG. 2) may obtain the electrical energy P2 (refer to FIG. 2) by using the light energy E_PH of the energy "E" transferred from the outside.

In operation S120, the wireless device 10 may generate the continuous, stable voltage "V" appropriate for driving the wireless device 10 by using the electrical energy "P" provided from the energy harvesting module 100 through the power management module 200 (refer to FIG. 1). In detail, the power management module 200 may be provided with the electrical energy "P" from the energy harvesting module 100, may extract a maximum of electrical energy from the first to n-th MPPT circuits 210_1, 210_2 . . . 210_n (refer to FIG. 3), and may generate the continuous, stable voltage "V" through the CPT circuit 220 (refer to FIG. 3).

In operation S130, the power management module 200 of the wireless device 10 may supply the stable voltage "V" thus generated to the communication module 300 (refer to FIG. 1). The power management module 200 may continuously output the stored energy through controlling a comparator by adjusting an analog control sequence such that there occurs no case where the input energy of the CPT circuit 220 is not transferred to an output due to insufficient input energy or the input energy is fully charged at the same time. Also, the power management module 200 may control a frequency and a duty of a boost (or buck) converter, which generates an output voltage from a voltage input from the first to n-th input capacitors C_IN_1, C_IN_2 . . . C_IN_n, through the main control circuit 230 (refer to FIG. 3).

In operation S140, the power management module 200 may drive the wireless device 10 by using the stable voltage "V". For example, the wireless device 10 may emit a laser beam to the outside by using the stable voltage "V" thus supplied or may control a display device capable of communicating with the wireless device 10 and a movement of a pointer on the display device.

Figure 7:
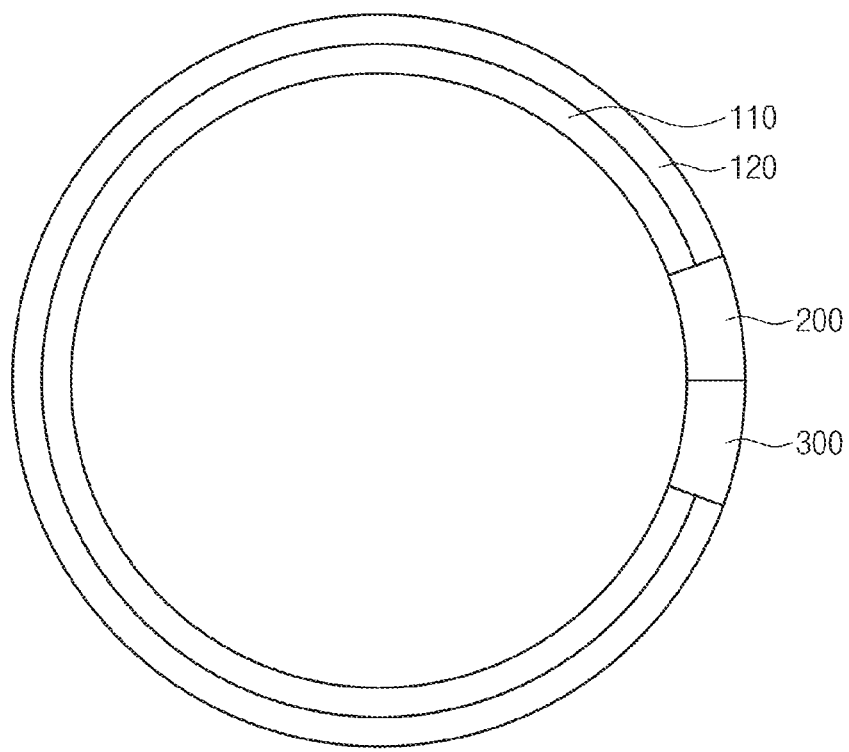
FIG. 7 is a diagram illustrating a wireless device applied to a wearable device according to an embodiment of the present disclosure.

FIG. 7 is a diagram illustrating the wireless device 10 (refer to FIG. 1) applied to a wearable device 10a, according to an embodiment of the present disclosure. Referring to FIG. 7, the wearable device 10a may include the thermoelectric element array 110, the photoelectric element array 120, the power management module 200, the communication module 300, and a user input interface (not illustrated).

The wearable device 10a may be implemented in a ring shape, and the user may wear the wearable device 10a, for example, in the form of a wrist watch. In the wearable device 10a, the thermoelectric element array 110 included in the energy harvesting module 100 (refer to FIG. 1) may be disposed to be in contact with a body of the user such that thermal energy is supplied thereto. The photoelectric element array 120 included in the energy harvesting module 100 may be disposed on an outer surface of the wearable device 10a so as to be exposed to a light of the sun or the like.

An example where the thermoelectric element array 110 and the photoelectric element array 120 are in contact with each other is illustrated in FIG. 7, but a substrate may be further provided between the thermoelectric element array 110 and the photoelectric element array 120. For example, the substrate may be a flexible substrate. Also, the user input interface may be disposed on a surface of the wearable device 10a. The wearable device 10a is illustrated in FIG. 7 in the form of a ring-shaped wrist watch as only one embodiment, but the present disclosure is not limited thereto. For example, the wireless device 10 according to the present disclosure may be implemented in any form capable of performing an energy harvesting operation.

The energy harvesting module 100 may generate the electrical energy "P" (refer to FIG. 1) by using the thermal energy E_HT (refer to FIG. 2) and the light energy E_PH (refer to FIG. 2) transferred from the outside. The electrical energy "P" generated from the energy harvesting module 100 may be supplied as the stable voltage "V" (refer to FIG. 1) for driving the wireless device 10 through the power management module 200. In response to an access of the user to the user input interface 400 (refer to FIG. 1), the communication module 300 may be supplied with the stable voltage "V" and may transfer, to an external device, a command (or instruction) corresponding to the access of the user input to the user input interface 400.

Figure 8:
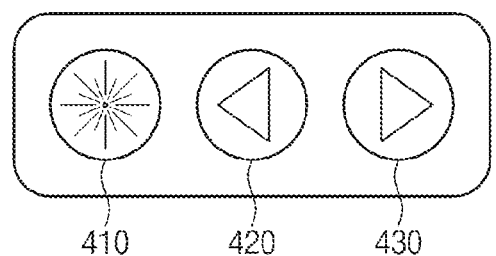
FIG. 8 is a diagram illustrating an embodiment of a user input interface included in a wireless device according to an embodiment of the present disclosure.

FIG. 8 is a diagram illustrating an embodiment of the user input interface 400 included in the wireless device 10 (refer to FIG. 1) according to an embodiment of the present disclosure. In detail, FIG. 8 is a diagram disclosing an embodiment of the user input interface 400 included in the wireless device 10 in the case where the wireless device 10 is a wireless laser controller. The user input interface 400 is disclosed in FIG. 8 as including a first button 410, a second button 420, and a third button 430 as only one embodiment, not intended to limit a configuration of the user input interface 400 used in the present disclosure.

As disclosed in FIGS. 1 to 7, the wireless device 10 according to an embodiment of the present disclosure may supply the electrical energy "P" (refer to FIG. 1) generated from the energy harvesting module 100 (refer to FIG. 1) to the power management module 200, and the power management module 200 may generate the stable voltage "V" (refer to FIG. 1) based on the electrical energy "P". The stable voltage "V" generated from the power management module 200 may be supplied to the communication module 300 (refer to FIG. 1) such that the wireless device 10 is driven based on an access of the user to the user input interface 400.

In an embodiment of the present disclosure, the first button 410, the second button 420, and the third button 430 may be accessed by the user. The user input interface 400 may transfer the command signal "C" corresponding to the access of the user to each of the first to third buttons 410, 420, and 430 to the communication module 300. For example, when the access of the user to the first button 410 is sensed, the user input interface 400 may transfer the command signal "C" for emitting a laser beam to the outside to the communication module 300. The communication module 300 may transfer a command (or instruction) for emitting a laser beam to the outside to a light source being another component included in the wireless device 10, based on the command signal "C".

Also, when the access of the user to the second button 420 and the third button 430 is sensed, the user input interface 400 may transfer the command signal "C" for controlling an external display device compatible with the wireless device 10 to the communication module 300. The communication module 300 may generate a control signal based on the command signal "C" and may send the generated control signal to an external display device, computer, or mobile device.

According to embodiments of the present disclosure, a wireless device capable of being self-powered without a separate external power and an operating method of the wireless device are provided.

According to embodiments of the present disclosure, because a wireless device does not include an internal battery, a wireless device capable of being miniaturized and an operating method of the wireless device are provided.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A wireless device capable of being self-powered, comprising:
    an energy harvesting circuit, including a plurality of energy harvesting elements, configured to generate electrical energy based on converting energy supplied from outside the wireless device;
    a power management circuit configured to generate a voltage at an output based on the electrical energy provided from the energy harvesting circuit, and including
        first-to-n-th maximum power point tracking (MPPT) circuits, wherein n is greater than 1, each configured to extract maximum energy of the electrical energy provided from a respective one of the plurality of energy harvesting elements of the energy harvesting circuit, and
        a continuous power transfer (CPT) circuit configured to continuously supply electrical energy extracted from the first-to-n-th MPPT circuits, the CPT circuit comprising first-to-n-th switches each connected between a respective one of the first-to-n-th MPPT circuits to receive respective first-to-n-th input voltages and the output;
    a user input interface including at least one input device configured to sense an input of a user; and
    a communication circuit configured to transfer a command corresponding to the input sensed by the at least one input device to an external device using the voltage provided from the power management circuit, in response to the at least one input device being accessed by the user;
    wherein the CPT circuit includes an analog-logic control circuit configured to selectively determine between outputting the first to n-th input voltages by controlling the first-to-n-th switches to close in turn or by controlling the first-to-n-th switches to close at a same time by implementing a logic sequence.

2. The wireless device of claim 1, wherein the energy harvesting circuit includes:
    a thermoelectric element array including a plurality of thermoelectric elements; and
    a photoelectric element array including a plurality of photoelectric elements.

3. The wireless device of claim 2, wherein each of the plurality of thermoelectric elements includes
    a heat absorption layer, a heat sink layer, a first doping material, and a second doping material,
    wherein the heat sink layer is disposed under each of the plurality of thermoelectric elements,
    wherein the first doping material and the second doping material are disposed on the heat sink layer so as to be spaced from each other, wherein the first doping material is connected with the heat sink layer by a first electrode, wherein the second doping material is connected with the heat sink layer by a second electrode, wherein a third electrode is disposed on the first doping material, wherein a fourth electrode is disposed on the second doping material, and wherein the heat absorption layer is disposed on the third electrode and the fourth electrode.

4. The wireless device of claim 3, wherein the heat absorption layer and the heat sink layer are formed of a metal substrate including aluminum (Al), aluminum (Al) alloy, copper (Cu), copper (Cu) alloy, or copper-aluminum (Cu—Al) alloy.

5. The wireless device of claim 3, wherein the heat absorption layer and the heat sink layer are formed of an alumina substrate or a polymer resin substrate.

6. The wireless device of claim 3, wherein the first electrode, the second electrode, the third electrode, and the fourth electrode are formed of a metal material including copper (Cu), silver (Ag), or nickel (Ni).

7. The wireless device of claim 2, wherein each of the plurality of photoelectric elements includes a first electrode, a second electrode, a first doping material, and a second doping material, wherein the first electrode is disposed under each of the plurality of photoelectric elements, wherein the first doping material is disposed on the first electrode, wherein the second doping material is disposed on the first doping material, and wherein the second electrode is disposed on the second doping material.

8. The wireless device of claim 1, wherein the power management circuit further includes:

a main control circuit configured to control the extracted electrical energy supplied from the CPT circuit.

9. The wireless device of claim 1, wherein the power management circuit generates the voltage using time-division between respective times the first-to-n-th switches are closed when the switches are controlled to close in turn.

10. The wireless device of claim 1, further comprising:

a light source configured to emit a laser beam to outside the wireless device in response to the at least one input device being accessed by the user.

11. The wireless device of claim 1, wherein, in response to the at least one input device being accessed by the user, the communication circuit generates a control signal for controlling an external display device and sends the control signal to the external display device.

12. An operating method of a wireless device capable of being self-powered, the method comprising:

obtaining, by an energy harvesting circuit including a plurality of energy harvesting elements, electrical energy from respective ones of the plurality of energy harvesting elements, including first electrical energy obtained from one or more thermoelectric elements of the plurality of energy harvesting elements converting thermal energy transferred from outside the wireless device;

generating, by first-to-n-th maximum power point tracking (MPPT) circuits extracting maximum energy from respective ones of the plurality of energy harvesting elements, wherein n is greater than 1, respective first-to-nth voltages including a first voltage extracted from the first electrical energy and a second voltage;

supplying continuously, by a continuous power transfer (CPT) circuit comprising first-to-n-th switches each connected between a respective one of the first-to-n-th MPPT circuits to receive the respective first-to-n-th voltages and an output, an output voltage at the output to a communication circuit; and driving the wireless device using the continuously supplied output voltage based on the first voltage and the second voltage;

wherein the continuous supplying of the output voltage includes selectively determining, by an analog-logic control circuit of the CPT circuit, between outputting the first-to-nth voltages by controlling the first-to-n-th switches to close in turn or by controlling the first-to-n-th switches to close at a same time by implementing a logic sequence.

13. The method of claim 12, further comprising:

obtaining second electrical energy from one or more photoelectric elements of the plurality of energy harvesting elements converting light energy transferred from the outside the wireless device; and generating, by a respective one of the first-to-n-th MPPT circuits, the second voltage for driving the wireless device extracted from the obtained second electrical energy.

14. The method of claim 13, wherein:

the continuous supplying of the output voltage includes controlling, by the analog-logic control circuit, time-division between respective times the first-to-n-th switches are closed when the switches are controlled to close in turn.

15. The method of claim 13, further comprising:

extracting first maximum energy of the first electrical energy by a first one of the first-to-n-th MPPT circuits; and extracting second maximum energy of the second electrical energy by a second one of the first-to-n-th MPPT circuits.

16. The method of claim 15, further comprising:

controlling the CPT circuit to selectively output the first maximum energy extracted from the first electrical energy and the second maximum energy extracted from the second electrical energy.

* * * * *